United States Patent [19]

Nakamura

[11] Patent Number: 5,137,797
[45] Date of Patent: Aug. 11, 1992

[54] IMAGE RECORDING MATERIAL CONTAINING SALICYLIC ACID DEVELOPER AND IMAGE RECORDING PROCESS EMPLOYING THE SAME

[75] Inventor: Taku Nakamura, Kanagawa, Japan

[73] Assignee: Fuji Photo Film Co., Ltd., Kanagawa, Japan

[21] Appl. No.: 602,561

[22] Filed: Oct. 24, 1990

[30] Foreign Application Priority Data

Oct. 24, 1989 [JP] Japan ................... 1-276523

[51] Int. Cl.$^5$ .................. G03C 5/54; C07C 65/10
[52] U.S. Cl. .................... 430/211; 430/138; 430/200; 430/203; 430/222; 430/253; 503/210; 503/211; 503/212; 503/216; 562/477
[58] Field of Search .............. 503/210-212, 503/216; 430/200, 203, 211, 222, 138, 253; 562/477

[56] References Cited

U.S. PATENT DOCUMENTS

| | | | |
|---|---|---|---|
| 3,864,146 | 2/1975 | Oda et al. | 503/216 |
| 3,896,255 | 7/1975 | Kato et al. | 503/216 |
| 3,934,070 | 1/1976 | Kimura et al. | 503/216 |
| 3,983,292 | 9/1976 | Saito et al. | 503/212 |
| 4,239,815 | 12/1980 | Kato et al. | 503/216 |
| 4,771,034 | 9/1988 | Ikeda et al. | 503/216 |
| 4,950,330 | 8/1990 | Saito et al. | 503/216 |

Primary Examiner—Richard L. Schilling
Attorney, Agent, or Firm—Sughrue, Mion, Zinn, Macpeak & Seas

[57] ABSTRACT

An image recording material comprises a support and an image recording layer provided thereon which contains a salicyclic acid derivative or its metal salt, which functions as a developer of a leuco dye to form a color image. A new salicylic acid developer is herein disclosed. The salicylic acid developer is a salicylic acid derivative having the formula (I) or its metal salt:

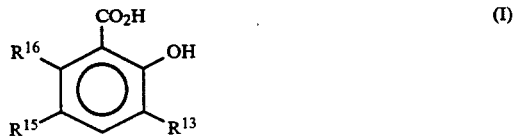

in which each of $R^{13}$ and $R^{15}$ independently is hydrogen, an alkyl group, an aryl group or a tertiary aralkyl group; $R^{16}$ is an alkyl group or an aryl group; and when $R^{15}$ is hydrogen $R^{13}$ is a tertiary aralkyl group. An image recording process employing the image recording material is also disclosed.

5 Claims, No Drawings

IMAGE RECORDING MATERIAL CONTAINING SALICYLIC ACID DEVELOPER AND IMAGE RECORDING PROCESS EMPLOYING THE SAME

FIELD OF THE INVENTION

The present invention relates to an image recording material containing a developer of a leuco dye.

BACKGROUND OF THE INVENTION

An image recording material containing a developer of a leuco dye has been used in various image recording processes. In the processes, a color image is formed on the image recording material by a reaction of a leuco dye with a developer.

The image recording processes using the leuco dye and the developer can be classified into a light-sensitive process (employing a photopolymerization initiator or silver halide as a photosensor), a pressure-sensitive process and a heat-sensitive process.

The light-sensitive image forming process employing a photopolymerization initiator as a photosensor is described in Japanese Patent Publication No. 64(1989)-7377 and U.S. Pat. No. 4,399,209. The light-sensitive process employing silver halide is disclosed in Japanese Patent Provisional Publication No. 61(1986)-275742 (corresponding to U.S. Pat. No. 4,912,011). The pressure-sensitive process is well known, and is employed in a conventional carbonless copy paper. The heat-sensitive process is also well known as a heat-sensitive copying process.

From another point of view, the image recording processes can be classified into two embodiments. One embodiment employs two sheets which contain the leuco dye and the developer respectively. The other embodiment employs one sheet which contains both of the leuco dye and the developer.

In the former embodiment, a color image is formed on an image recording material by imagewise transferring a leuco dye from an image forming material (such as a light-sensitive, pressure-sensitive or heat-sensitive material) containing the leuco dye to the image recording material.

In the latter embodiment, a color image is formed on an image recording material (which itself is light-sensitive, pressure-sensitive or heat-sensitive) by an imagewise reaction of a leuco dye with a developer in the image recording material.

As the developer of a leuco dye, a salicylic acid derivative or its metal salt has been frequently used. A typical and excellent developer is zinc 3,5-di-α-methylbenzylsalicylate shown below.

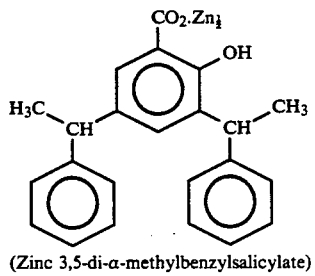

(Zinc 3,5-di-α-methylbenzylsalicylate)

The other salicylic acid developers are disclosed in Japanese Patent Publication No. 52(1977)-1327 and U.S. Pat. Nos. 3,864,146, No. 3,871,900, No. 3,896,255, No. 3,900,215, No. 3,924,027, No. 3,934,070, No. 3,983,292 and No. 4,046,941.

SUMMARY OF THE INVENTION

The present inventor has studied the above-mentioned known salicylic acid developer. A metal salt of a salicylic acid derivative such as zinc 3,5-di-α-methylbenzylsalicylate is excellent in color developing function. However, it has been noted that the salicylic acid developer itself tends to be colored (yellowish brown) in preservation. This phenomenon is mainly caused by light. Therefore, an image formed on an image recording material containing the salicylic acid developer is gradually tinged with yellowish brown.

An object of the invention is to provide an image recording material containing a salicylic acid developer which is excellent in both of color developing function and stability.

There is provided by the present invention, an image recording material comprising a support and an image recording layer provided thereon which contains a developer of a leuco dye, wherein the developer is a salicylic acid derivative having the formula (I) or its metal salt:

in which each of $R^{13}$ and $R^{15}$ independently is a monovalent group selected from the group consisting of hydrogen, an alkyl group, an aryl group and a tertiary aralkyl group; $R^{16}$ is an alkyl group or an aryl group; and when $R^{15}$ is hydrogen $R^{13}$ is a tertiary aralkyl group.

The image recording material can be used in various image recording processes, for example, an image recording process comprises imagewise transferring a leuco dye from an image forming material containing the leuco dye (such as a light-sensitive, pressure sensitive or heat-sensitive material) to the image recording material to form a color image on the image recording material.

According to study of the applicant, in the case that 3- or 5-position of salicylic acid is replaced with an aralkyl group having hydrogen at its α-position (namely, a primary or secondary aralkyl group), the salicylic acid developer tends to be oxidized by oxygen in the air to form a yellowish brown substance. This oxidation is accelerated by light irradiation. Therefore, the applicant searched for an appropriate substituent group at 3- or 5-position of salicylic acid other than the primary or secondary aralkyl group.

On the other hand, the substituent group at 3- or 5-position of salicylic acid is important to a color developing function. The applicant further notes the following order with respect to the color developing function of 3- or 5-position of salicylic acid.

Hydrogen < Aryl < Alkyl < Tertiary Aralkyl

Therefore, it is found that 3- or 5-position of salicylic acid is preferably replaced with an alkyl group or a tertiary aralkyl group, and more preferably with a tertiary aralkyl group. The applicant has further found that it is particularly preferred to replace 3-position of salicylic acid with a tertiary aralkyl group in the case that 5-position is hydrogen.

The applicant has furthermore found that 6-position of salicylic acid is preferably replaced with an alkyl group or an aryl group. This 6.alkyl(or aryl)salicylic acid is excellent in color developing function, since it has a high solubility in an oil (i.e., medium of the developer) compared with a salicylic acid derivative having hydrogen at its 6-position.

For the reasons mentioned above, the salicylic acid derivative having the formula (I) or a metal salt thereof is excellent in both of color developing function and stability. Therefore, the image recording material of the present invention gives a clear and stable color image, which has a high color density and is not tinged with yellowish brown.

DETAILED DESCRIPTION OF THE INVENTION

The present invention is characterized in that the developer is a salicylic acid derivative having the above-mentioned formula (I) or a metal salt thereof.

The formula (I) can be divided into the following formula (II) (in the case that $R^{15}$ in the formula (I) is hydrogen) and formula (III) (in the case that $R^{15}$ is not hydrogen, namely is an alkyl group, an aryl group or a tertiary aralkyl group).

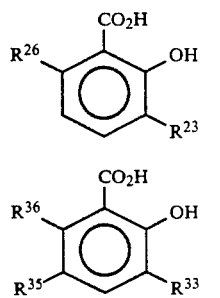

In the formula (II), $R^{23}$ is a tertiary aralkyl group. In the present specification, the term "tertiary aralkyl group" is defined in the following formula.

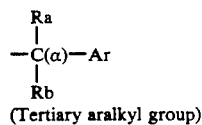

(Tertiary aralkyl group)

wherein each of Ra and Rb independently is an alkyl group, an aryl group or an aralkyl group (an alkyl group is preferred, and the alkyl group more preferably has 1-6 carbon atoms.); and Ar is an aryl group or an aralkyl group (an aryl group is preferred, and phenyl is most preferred.).

In the formula (II), $R^{26}$ is an alkyl group or an aryl group. Phenyl or methyl is particularly preferred.

In the formula (III), $R^{33}$ is hydrogen, an alkyl group, an aryl group or a tertiary aralkyl group. An alkyl group or a tertiary aralkyl group is preferred, and the alkyl group more preferably is a tertiary alkyl group.

In the formula (III), $R^{35}$ is an alkyl group, an aryl group or a tertiary aralkyl group. An alkyl group or a tertiary aralkyl group is preferred.

In the formula (III), $R^{36}$ is an alkyl group or an aryl group. Phenyl or methyl is particularly preferred.

Examples of the above-mentioned tertiary aralkyl group include α,α-dimethylbenzyl, α,α-diethylbenzyl, α-methyl-α-ethylbenzyl, α-methyl-α-propylbenzyl and α-methyl-α-isobutylbenzyl. Particularly preferred is α,α-dimethylbenzyl.

The above-mentioned alkyl group preferably has 1-20 carbon atoms, and more preferably has 1-10 carbon atoms. Examples of the alkyl group include methyl, ethyl, n-propyl, isopropyl, n-butyl, sec-butyl, tert-butyl, sec-amyl, tert-amyl, cyclohexyl, tert-hexyl, 2-ethylhexyl, tert-octyl and tert-nonyl.

Examples of the aryl group include phenyl, tolyl, p-methoxyphenyl, p-acetylaminophenyl, m-acetylphenyl, 1-naphthyl and 2-naphthyl. Phenyl is particularly preferred.

Examples of the salicylic acid derivative having the formula (I) (namely (II) or (III)) are shown below.

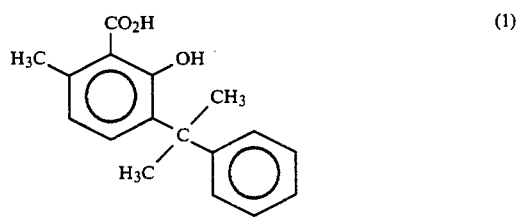

(1)

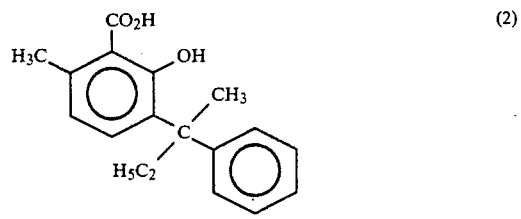

(2)

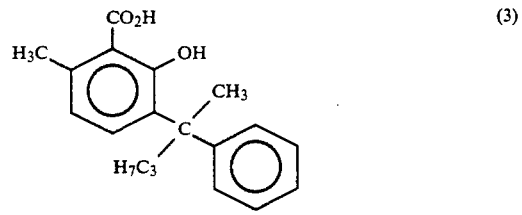

(3)

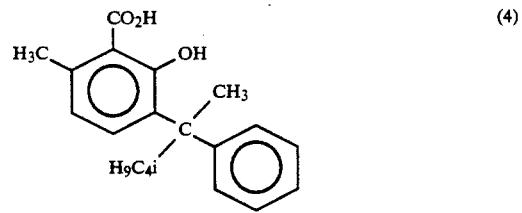

(4)

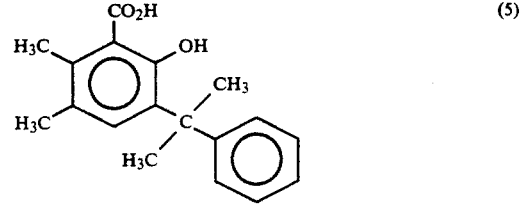

(5)

(6) 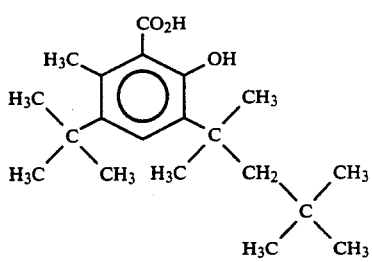

(7) 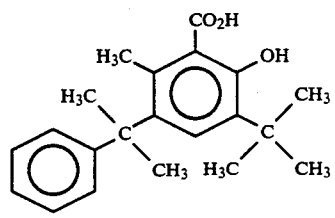

(8) 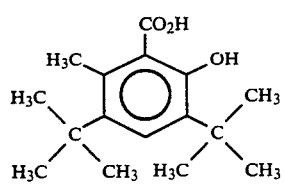

(9) 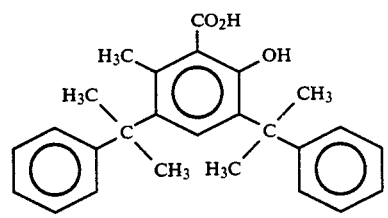

(10) 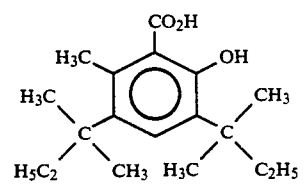

(11) 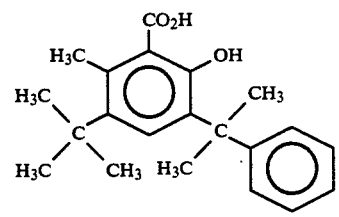

(12) 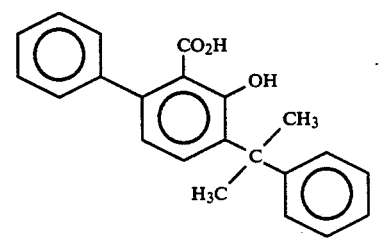

(13) 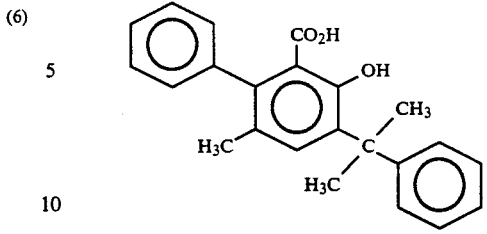

(14) 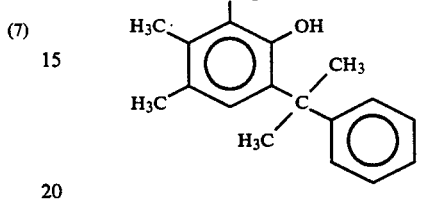

It is preferred that the developer is a metal salt of the salicylic acid derivative having the formula (I). Examples of the metal of the salt include the group Ib metals such as copper and silver; the group IIa metals such as magnesium and calcium; the group IIb metals such as zinc, cadmium and mercury; the group IIIb metals such as aluminium and gallium; the group IVb metals such as tin and lead; the group VIa metals such as chromium and molybdenum; the group VIIa metals such as manganese; the group VIII metals such as cobalt and nickel. Zinc, tin, aluminium and nickel are preferred. Zinc is particularly preferred.

The salicylic acid developer of the present invention is preferably contained in the image recording layer in a coating amount of 0.1 to 50 g/m², and more preferably 0.1 to 50 g/m².

In the image recording process using the developer of the present invention and a leuco dye, the developer is preferably used in an amount of 0.3 to 80 parts by weight based on one part by weight of the leuco dye.

The image recording process employing the image recording material of the present invention is hereinafter described below.

As is described in "BACKGROUND OF THE INVENTION" of this specification, the image recording processes using the leuco dye and the developer can be classified into (1) a light-sensitive process employing silver halide as a photosensor; (2) a light-sensitive process employing a photopolymerization initiator as a photosensor; (3) a pressure-sensitive process; and (4) a heat-sensitive process.

From another point of view, the image recording processes can be classified into two embodiments, namely (a) one embodiment employing two sheets which contain the leuco dye and the developer respectively; and (b) the other embodiment employing one sheet which contains both of the leuco dye and the developer.

Therefore, the image recording process of the present invention can be classified into eight embodiments (1a), (1b), (2a), (2b), (3a), (3b), (4a) and (4b).

The embodiment (1a) employs a light-sensitive material as an image forming material in addition to the image recording material of the present invention. The light-sensitive material comprises a support and a light-sensitive layer provided thereon which contains silver halide, a reducing agent, an ethylenically unsaturated polymerizable compound and a leuco dye. The silver halide, the reducing agent, the polymerizable compound and the leuco dye are preferably contained in microcapsules which are dispersed in the light-sensitive layer. The embodiment (1a) comprises the steps of: imagewise exposing to light the light-sensitive material; developing the light-sensitive material to imagewise polymerize the polymerizable compound; and pressing the light-sensitive material on an image recording material containing the developer of the invention to transfer the unpolymerized polymerizable compound with the leuco dye to the image recording material. Thus, a color image is formed on the image recording material by the reaction of the leuco dye with the developer.

The embodiment (1b) employs a light-sensitive material as the image recording material of the present invention. The light-sensitive image recording material comprises a support and a light-sensitive layer provided thereon which contains silver halide, a reducing agent, an ethylenically unsaturated polymerizable compound, a leuco dye and the developer of the invention. The leuco dye and the developer are separated from each other. For example, the silver halide, the reducing agent, the polymerizable compound and the leuco dye are contained in microcapsules which are dispersed in the light-sensitive layer, and the developer is arranged outside of the microcapsules. The embodiment (1b) comprises the steps of: imagewise exposing to light the light-sensitive image recording material; developing the light-sensitive image recording material to imagewise polymerize the polymerizable compound; and pressing the light-sensitive material to allow the leuco dye to imagewise react with the developer. Thus, a color image is formed on the light-sensitive image recording material.

The embodiment (2a) employs a light-sensitive material as an image forming material in addition to the image recording material of the present invention. The light-sensitive material comprises a support and a light-sensitive layer provided thereon which contains a photopolymerization initiator, an ethylenically unsaturated polymerizable compound and a leuco dye. The photopolymerization initiator, the polymerizable compound and the leuco dye are preferably contained in microcapsules which are dispersed in the light-sensitive layer. The embodiment (2a) comprises the steps of: imagewise exposing to light the light-sensitive material to imagewise polymerize the polymerizable compound; and pressing the light-sensitive material on an image recording material containing the developer of the invention to transfer the unpolymerized polymerizable compound with the leuco dye to the image recording material. Thus, a color image is formed on the image recording material.

The embodiment (2b) employs a light-sensitive material as the image recording material of the present invention. The light-sensitive image recording material comprises a support and a light-sensitive layer provided thereon which contains a photopolymerization initiator, an ethylenically unsaturated polymerizable compound, a leuco dye and the developer of the invention. The leuco dye and the developer are separated from each other. For example, the photopolymerization initiator, the polymerizable compound and the leuco dye are contained in microcapsules which are dispersed in the light-sensitive layer, and the developer is arranged outside of the microcapsules. The embodiment (2b) comprises the steps of: imagewise exposing to light the light-sensitive image recording material to imagewise polymerize the polymerizable compound; and pressing the light-sensitive image recording material to allow the leuco dye to imagewise react with the developer. Thus, a color image is formed on the light-sensitive image recording material.

The embodiment (3a) employs a pressure-sensitive material as an image forming material in addition to the image recording material of the present invention. The pressure-sensitive material comprises a support and a pressure-sensitive layer provided thereon which contains a leuco dye. The leuco dye is contained in microcapsules which are dispersed in the pressure-sensitive layer. The embodiment (3a) comprises imagewise pressing the pressure-sensitive material on an image recording material containing the developer of the invention to transfer the leuco dye to the image recording material. Thus, a color image is formed on the image recording material.

The embodiment (3b) employs a pressure-sensitive material as the image recording material of the present invention. The pressure-sensitive image recording material comprises a support and a light-sensitive layer provided thereon which contains a leuco dye and the developer of the invention. The leuco dye and the developer are separated from each other. For example, the leuco dye are contained in microcapsules which are dispersed in the pressure-sensitive layer, and the developer is arranged outside of the microcapsules. The embodiment (3b) comprises imagewise pressing the pressure-sensitive image recording material to allow the leuco dye to imagewise react with the developer. Thus, a color image is formed on the pressure-sensitive image recording material.

The embodiment (4a) employs a heat-sensitive material as an image forming material in addition to the image recording material of the present invention. The heat-sensitive material comprises a support and a heat-sensitive layer provided thereon which contains a leuco dye. The leuco dye is contained in microcapsules which are dispersed in the heat-sensitive layer. The embodiment (4a) comprises imagewise heating the heat-sensitive material on an image recording material containing the developer of the invention to transfer the leuco dye to the image recording material. Thus, a color image is formed on the image recording material.

The embodiment (4b) employs a heat-sensitive material as the image recording material of the present invention. The heat-sensitive image recording material comprises a support and a heat-sensitive layer provided thereon which contains a leuco dye and the developer of the invention. The leuco dye and the developer are separated from each other. For example, the leuco dye are contained in microcapsules which are dispersed in the heat-sensitive layer, and the developer is arranged outside of the microcapsules. The embodiment (3b) comprises imagewise heating the heat-sensitive image recording material to allow the leuco dye to imagewise react with the developer. Thus, a color image is formed on the heat-sensitive image recording material.

In the above-described embodiments (1a), (2a), (3a) and (4a), the image recording material of the invention has a rather simple structure as an image receiving sheet.

With respect to the embodiments (1a), (2a), (3a) and (4a), the optional components contained in the image recording layer are described below.

Examples of the optional components include a white pigment, a binder, a thermoplastic compound, a photopolymerization initiator or a thermal polymerization initiator, and a dye or a pigment.

A white pigment itself or the space among the white pigment particles absorbs a polymerizable compound or an oil containing a leuco dye transferred from an image forming material.

The white pigment is classified into an inorganic pigment and an organic pigment. Examples of the inorganic pigment include oxides such as silicon oxide, titanium oxide, zinc oxide, magnesium oxide and aluminium oxide; salts of alkaline earth metals such as magnesium sulfate, barium sulfate, calcium sulfate, magnesium carbonate, barium carbonate, calcium carbonate, calcium silicate, magnesium hydroxide, magnesium phosphate and magnesium hydrogenphosphate; and others such as aluminium silicate, aluminum hydroxide, zinc sulfide, various kinds of clay, talc, kaolin, zeolite, acid clay, soluble clay and glass. Examples of the organic pigment include polyethylene, polystylene, benzoguanamine resin, urea-formalin resin, melamine-formalin resin and polyamide resin. The white pigments can be used singly or in combination. A white pigment preferably absorbs a large amount of an oil containing a leuco dye.

The white pigment preferably has a mean particle size in the range of 0.1 to 20 $\mu$m, and more preferably 0.1 to 10 $\mu$m. The white pigment is preferably contained in the image recording layer in an amount of 0.1 to 60 g/m$^2$, and more preferably 0.5 to 30 g/m$^2$. The weight ratio of the white pigment to a binder preferably is in the range of 0.01 to 0.4, and more preferably 0.03 to 0.3.

As the binder, a water-soluble polymer, a polymer latex and a polymer soluble in an organic solvent are employed.

Examples of the water-soluble polymer include cellulose derivatives such as carboxymethylcellulose, hydroxyethylcellulose and methylcellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrolidone, polyacrylic acid, polymethacrylic acid, polyacrylamide, polyvinyl imidazole, polyvinyl pirazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polyacrylate latex, polymethacrylate latex, acylate-methacrylate copolymer latex and ethylene-vinyl acetate copolymer latex.

Examples of the polymer soluble in an organic solvent include polyester resin, polyurethane resin, polyvinyl chloride resin and polyacrylonitrile resin.

The binders can be used singly or in combination. A combination of two or more binders can be employed to cause a phase separation in the image recording layer.

A thermoplastic compound may be contained in the image recording layer. In the case that the thermoplastic compound is contained in the image recording layer, the image recording layer itself is preferably composed of an agglomerate of fine particles of the thermoplastic compound (i.e., granular thermoplastic compound). The image recording layer having this constitute has such advantages that the formation of a transferred image can be readily done and a glossy image can be obtained under heating after the image formation. There is no specific limitation on the thermoplastic compounds, and any known thermoplastic resins (plastics) and waxes can be employed. The glass transition point of the thermoplastic resin or the melting point of the wax preferably is not higher than 200° C.

A photopolymerization initiator or a thermal polymerization initiator may be contained in the image recording layer. In the embodiments (1a) and (2a), a leuco is transferred together with the unpolymerized polymerizable compound. Therefore, the photopolymerization initiator or the thermal polymerization initiator can be incorporated into the image recording layer to cure the unpolymerized polymerizable compound.

A dye or a pigment may be contained in the image recording layer for the purpose of entering letters, symbols, frames in the image recording layer, or giving a certain color to the background of the image. Further, the dye or pigment can be also employed for the purpose of making it easy to distinguish the front and back surfaces of the image recording material. As the dye or the pigment, there can be used various known dyes or pigments such as those employable for the conventional image formation. However, in the case that the dye or the pigment may disturb the resulting image formed on the image recording layer, it is preferred to make the density of the dye or the pigment lower (e.g., reflection density of not higher than 1), or to use a dye or a pigment having a property of being decolored when it is heated or irradiated with light.

The above-mentioned dye or pigment can be either uniformly or locally contained in the image recording layer. For example, if the support is composed of a material having light transmission properties and the image recording layer locally contains the white pigment, a part of a reflection image can be made a projected image. Therefore, image information which is unnecessary for the projected image can be also recorded as a reflection image on the image recording layer containing the white pigment.

The image recording layer can be composed of two or more layers depending on the above-mentioned functions. The thickness of the image recording layer preferably ranges from 5 to 500 $\mu$m, more preferably from 10 to 200 $\mu$m.

A protective layer may be further provided on the image recording layer. A layer composed of an agglomerate of granular thermoplastic compound can be also provided on the image recording layer.

Further, a layer containing an adhesive and a release paper can be provided on the support on the opposite side of the image recording layer.

Examples of the materials employable for the preparation of the support of the image recording material include glasses, ordinary papers, fine paper, baryta paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

The light-sensitive material used in the embodiments (1a), (1b), (2a) and (2b) is described hereinafter.

First, the main components of the embodiments (1a) and (1b) such as silver halide, a reducing agent, an ethylenically unsaturated polymerizable compound and a leuco dye are described below in detail.

Examples of the silver halide employable for the light-sensitive material include silver chloride, silver bromide, silver iodide, silver chlorobromide, silver chloroiodide, silver iodobromide and silver chloroiodobromide in the form of grains.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide.

The silver halide grains may be of various crystal forms, for example, a regular crystal form such as hexahedron, octahedron or tetradecahedron, an irregular form such as spherical form or tubular form, a form having crystalline defect such as a twinning plane, and a mixed form thereof.

The silver halide grains may be extremely small sized grains having a grain diameter of not more than approx. 0.01 $\mu$m, or may be relatively large sized grains having a grain diameter of projected area up to about 10 $\mu$m. The silver halide emulsion may be a polydispersed emulsion or a monodispersed emulsion.

Also preferred is a monodispersed emulsion, which is described in U.S. Pat. Nos. 3,574,628 and No. 3,655,394 and U.K. Patent No. 1,413,748.

Two or more kinds of silver halide grains which differ in halogen composition, crystal habit, grain size and/or other features from each other can be employed in combination.

It is preferred to use silver halide grains having a relatively low fogging value.

The silver halide photographic emulsions employable in the light-sensitive material of the invention can be prepared by processes described, for example, in Research Disclosure (RD), No. 17,643, pp. 22–23 (Dec. 1978), (Emulsion preparation and types) and No. 18,716, p. 648, (Nov. 1979); P. Glafkides, "Chemie et Phisique Photographique (Paul Montel, 1967)"; G. F. Duffin, "Photographic Emulsion Chemistry (Focal Press, 1966)"; and V. L. Zelikman et al., "Making and Coating Photographic Emulsion (Focal Press, 1964)".

A tubular grain having an aspect ratio of not less than about 5 can be also employed. The tubular silver halide grains can be easily prepared by processes described in Gutoff, "Photographic Science and Engineering, Vol. 14, pp. 248–257 (1970)"; U.S. Pat. Nos. 4,434,226, No. 4,414,310, No. 4,433,048 and No. 4,439,520 and U.K. Patent No. 2,112,157.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the above-mentioned Research Disclosure, and the relevant parts in the literature are also shown in the following table.

| Additives | RD 17,643 | RD 18,716 |
|---|---|---|
| 1. Chemical sensitizing agent | p. 23 | p. 648 (right side) |
| 2. Sensitivity-increasing agent | | p. 648 (right side) |
| 3. Spectral sensitizing agent | p. 23–24 | p. 648– (right side) |
| Supersensitizing agent | | p. 649 (right side) |
| 4. Brightening agent | p. 24 | |
| 5. Antifogging agent and stabilizer | p. 24–25 | p. 649– (right side) |

A water-soluble vinyl polymer can be adsorbed on the silver halide grains.

For uniformly incorporating the silver halide into microcapsules, a copolymer composed of a hydrophilic repeating unit and a hydrophobic repeating unit is preferably dissolved in the polymerizable compound.

The amount of the silver halide contained in the light-sensitive layer preferably is in the range of 0.1 mg/m$^2$ to 10 g/m$^2$ in terms of silver contained in the silver halide and the later-described organic silver salt which is one of optional components. The amount of the silver halide contained in the light-sensitive layer preferably is not more than 1 g/m$^2$, more preferably in the range of 1 to 500 mg/m$^2$, in terms of silver contained in the silver halide only.

The reducing agent employable in the light-sensitive material has a function of reducing the silver halide and/or a function of accelerating (or restraining) polymerization of the polymerizable compound. There are known various reducing agents having the above-mentioned functions. Examples of such reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones and hydrazines.

By adjusting the nature or amount of the above reducing agent, the polymerization reaction of the polymerizable compound can be accelerated or restrained within the area where a latent image of the silver halide has been formed. In a system wherein the polymerization of the polymerizable compound is restrained or inhibited within the area where a latent image of the silver halide has been formed, 1-phenyl-3-pyrazolidones, hydroquinones and sulfonamidephenols are particularly preferred as the reducing agent. In a system wherein the polymerization of the polymerizable compound is accelerated within the area where a latent image of the silver halide has been formed, a hydrazine derivative is particularly preferred as the reducing agent.

Various reducing agents having the above-mentioned functions (including compounds referred to as a developing agent or a hydrazine derivative) are described in U.S. Pat. Nos. 4,859,568, No. 4,792,514, No. 4,735,884 and No. 4,772,531, and European Patent Provisional Publication No. 0202490A2, No. 0219087A2 and No. 0235751A2. These reducing agents are also described in T. James, "The Theory of the Photographic Process", 4th edition, pp. 291–334 (1977), Research Disclosure Vol. 170, No. 17029, pp. 9-15 (June 1978), and Research Disclosure Vol. 176, No. 17643, pp. 22-31 (December 1978). Further, the reducing agent can be in the form of a precursor capable of releasing a reducing agent under heating or in contact with a base. Also in the light-sensitive material of the invention, various reducing agents and reducing agent precursors described in the above publications can be effectively employed.

A basic reducing agent, which may form a salt with an acid, can be used in the form of a salt with an appropriate acid.

The reducing agents can be used singly or in combination. In the case that two or more reducing agents are used in combination, certain interactions between the reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of the reducing agents are shown below.

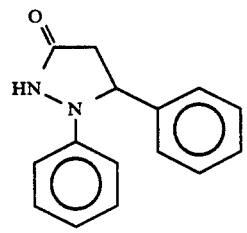
(1)

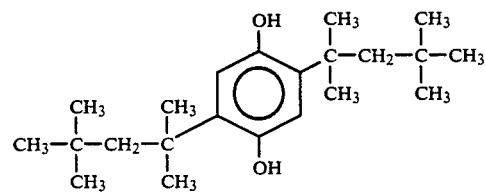
(2)

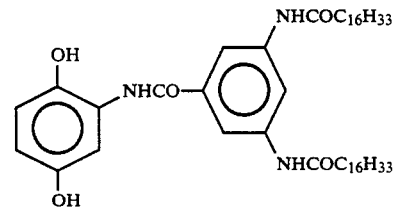
(3)

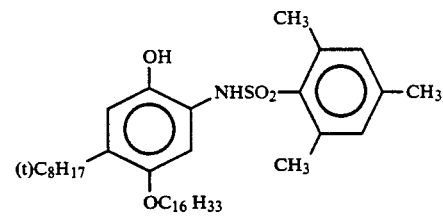
(4)

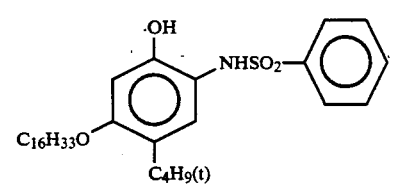
(5)

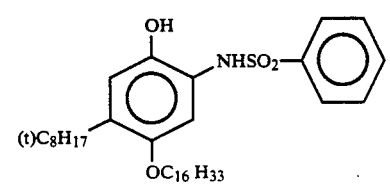
(6)

-continued

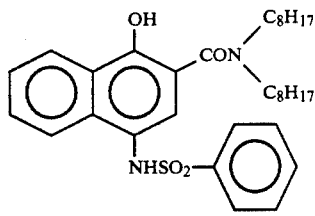
(7)

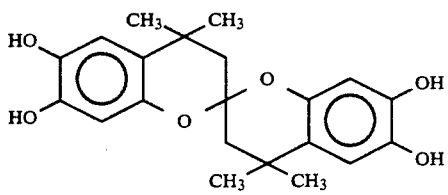
(8)

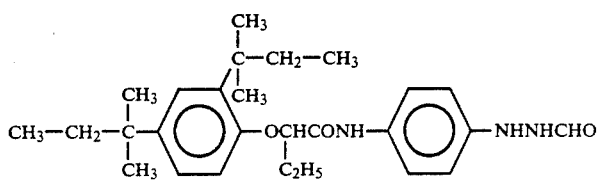
(9)

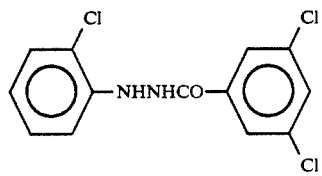
(10)

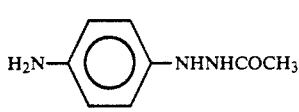
(11)

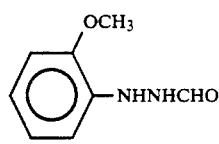
(12)

The reducing agent can be used in the light-sensitive material in an amount of wide range. The amount of the reducing agent is generally in the range of 0.1 to 1,500 mole %, preferably in the range of 10 to 300 mole %, based on the amount of the silver salt.

There is no specific limitation on the polymerizable compound. Therefore, any known polymerizable compounds having an ethylenically unsaturated group can be employed. If a heat development process is expected in the use of a light-sensitive material of the embodiments (1a) and (1b), it is preferred to use a compound having a high boiling point (e.g., 80° C. or higher) that hardly evaporates upon heating. The leuco dye is fixed by the polymerization reaction of the polymerizable compound, so that the polymerizable compound preferably is a cross-linkable compound having plural ethylenically unsaturated groups in the molecule.

The compounds having an ethylenic unsaturated group include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxane diacrylate, 2-(2-hydroxy-1,1-dimethylethyl)-5,5-dihydroxymethyl-1,3-dioxane triacrylate, triacrylate of propyleneoxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds in which a polymerizable functional group such as a vinyl group or a vinylidene group is introduced into a chemical structure of the reducing agent used in the embodiments (1a) and (1b) can be also employed as the polymerizable compound. The polymerizable compound can be preferably used in the light-sensitive material in an amount of 5 to 120,000 weight parts, more preferably 12 to 12,000 weight parts, based on one weight part of the silver halide.

There is no specific limitation with respect to the leuco dye used in the present invention. Various compounds are known as the leuco dyes. The known leuco dyes are described in Moriga and Yoshida, "Dyes and Agents" (written in Japanese) 9, p. 84, (society of the chemical product industry in Japan, 1964); "Handbook of Dyes (new edition)" p. 242 (Maruzene, 1970); R. Garmer "Reports on the Progress of Appl. Chem." 56. p. 199 (1971); and "Dyes and Agents" 19, p. 230, (society of the chemical product industry in Japan, 1974).

The leuco dyes are classified under the chemical structure. Preferred examples of the leuco dyes include diarylphthalide dyes, fluoran dyes, indolylphthalide dyes, acylluecoazine dyes, leucoauramine dyes, spiropyrane dyes, rhodaminelactam dyes, triarylmethane dyes and chromene dyes.

The leuco dye is preferably contained in the layer of the light-sensitive, pressure-sensitive or heat-sensitive material in an amount of 0.1 g/m² to 10 g/m².

An organic silver salt, a radical generator, a base or base precursor, a hot melt solvent, an antioxidant, a thermal polymerization initiator and a photopolymerization initiator, which can be optionally used for the light-sensitive material of the embodiments (1a) and (1b), are described below.

In the embodiments (1a) and (1b), an organic metallic salt can be used as an oxidizing agent in combination with silver halide. An organic silver salt is most preferably employed.

Examples of organic compounds employable for forming such organic silver salt oxidizing agents are benztriazoles, aliphatic acids and other compounds described in U.S. Pat. No. 4,500,626 (columns 52–53). Also effectively employable are silver salts of carboxylic acids having alkynyl group (e.g., silver phenylpropionate) and acetylene silver salt. The organic silver salts can be used in combination or two or more kinds.

The organic silver salt is generally used in an amount of from 0.01 to 10 mole(s), preferably from 0.01 to 1 mole, per 1 mole of the light-sensitive silver halide.

A radical generator which takes part in the polymerization acceleration by the aforementioned reducing agent may be contained in the light-sensitive layer of the embodiments (1a) and (1b). Triazenesilver, silver diazotate and an azo compound are preferably used as the radical generator.

The light-sensitive material of the embodiments (1a) and (1b) may further contain a base or a base precursor as a color image formation accelerator.

As the base and the base precursor employable in the light-sensitive material of the invention, there can be mentioned inorganic or organic bases and their base precursors (e.g., decarboxylation type, thermal decomposition type, reaction type and complex salt-formation type).

Preferred examples of the base precursors include salts of organic acids and bases which decarboxylate under heating; and compounds releasing bases under heating.

The base precursor employable in the invention preferably releases a base at a temperature ranging from 50° to 200° C., and more preferably from 80° to 180° C.

A process for releasing a base through a reaction between two compounds and a process for releasing a base through electrolysis are also employed as an base forming reaction.

The base or the base precursor can be used in the light-sensitive material in an amount of wide range. The amount of the base precursor is generally not more than 100% by weight, preferably in the range of 0.1 to 40% by weight based on the total weight of the coated light-sensitive layer. In the present invention, the base and/or the base precursor can be used singly or in combination of two or more kinds.

In the case of using a base or a base precursor in the light-sensitive material, the base or the base precursor may be arranged outside of the microcapsules.

The base or the base precursor may be contained in the microcapsules. The base precursor can be introduced into the microcapsules by directly dispersing the solid base precursor in the polymerizable compound, or emulsifying an aqueous dispersion of the base precursor in the polymerizable compound.

Examples of the bases and the base precursors are given below.

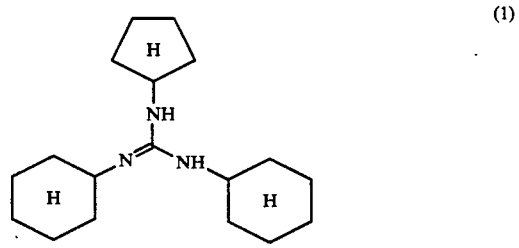

(1)

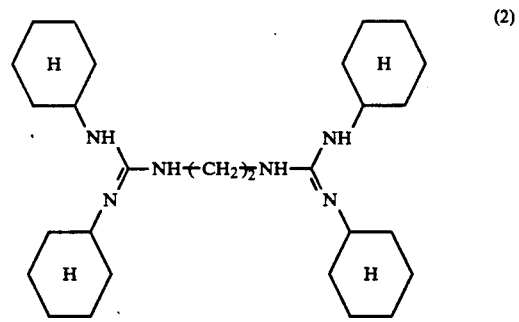

(2)

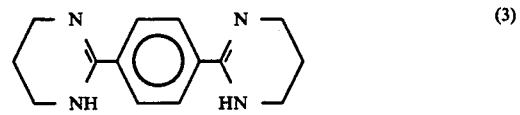

(3)

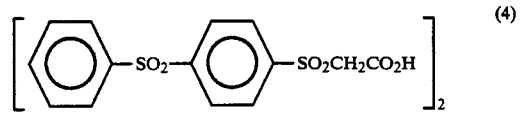

(4)

-continued

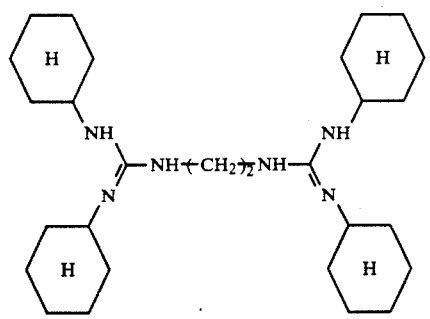

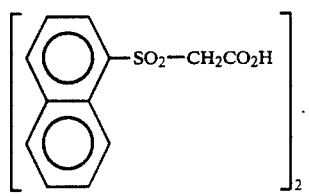

(5)

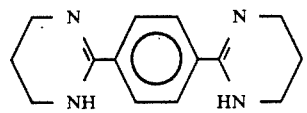

(6)

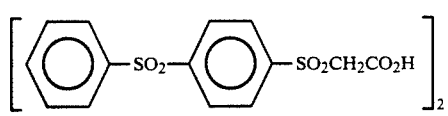

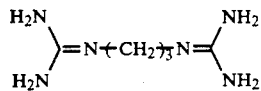

(7)

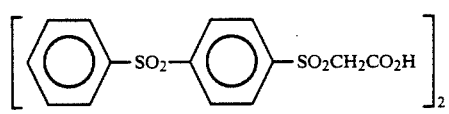

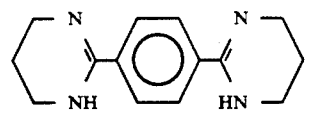

(8)

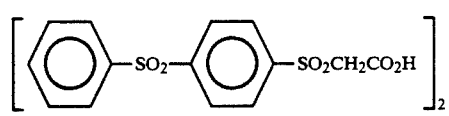

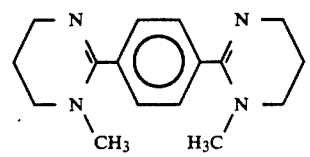

(9)

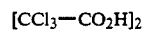
[CCl$_3$—CO$_2$H]$_2$

-continued

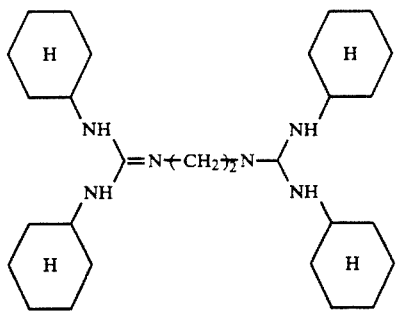

(10)

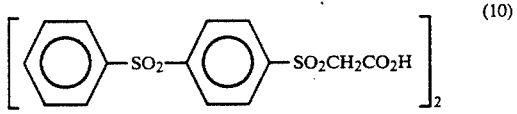

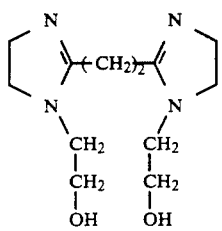

(11)

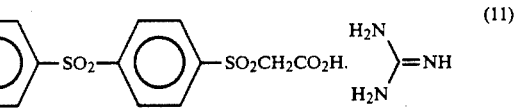

The hot-melt solvents preferably are compounds which may be used as a solvent of the reducing agent or those which have high dielectric constant and can accelerate physical development of silver salts. Examples of the hot-melt solvents include polyethylene glycols, derivatives of polyethylene oxides (e.g., oleate ester), bees wax, monostearin and high dielectric constant compounds having —SO$_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure, pp. 26-28 (December 1976).

The compounds functioning as an antioxidant can be employed for the purpose of eliminating the oxygen influence (oxygen has a function as a polymerization inhibitor). An example of the compounds functioning as an antioxidant is a compound having two or more mercapto groups.

Further, a liquid can be arranged outside of the light-sensitive microcapsules to prevent the influence of oxygen in the air. An example of the liquid is water.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile)., dimethyl 2,2'-azobisiso-butyrate, 2,2'-azobis(2-methylbutyronitrile), and azobis-dimethylvaleronitrile; organic peroxides, e.g., benzoyl peroxide, de-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiator is preferably used in an amount of from 0.1 to 120% by weight, more preferably from 1 to 10% by weight, based on the amount of the polymerizable compound. In a system in which the polymerizable compound within the area where the latent image has bot been formed is polymerized, the thermal polymerization initiators are preferably incorporated into the light-sensitive layer.

A photopolymerization initiator can be contained in the light-sensitive later of the light-sensitive material of the embodiments (1a) and (1b) for the purpose of polymerization of the transferred unpolymerized polymerizable compound.

Further, a water-releasing agent can be added to the light-sensitive material of the embodiments (1a) and (1b).

Next, the main components of the embodiments (2a) and (2b) such as a photopolymerization initiator are described below in detail.

Examples of the photopolymerization initiators include α-alkoxyphenyl ketones, polycyclic quinones, benzophenones and substituted benzophenones, xanthones, thioxanthones, halogenated compounds (e.g., chlorosulfonyl and chloromethyl polycyclic aromatic compounds, chlorosulfonyl and chloromethyl heterocyclic compounds, chlorosulfonyl and chloromethyl benzophenones, and chlorosulfonyl and chloromethyl fluorenones), haloalkanes, α-halo-α-phenyl acetophenones, photo-reducing dye reducing redox couples, halogenated paraffins (e.g., brominated or chlorinated paraffin), benzoalkyl ethers, rofindimer-mercapto compound couples and organic boron compound anionic salts of organic cationic compounds.

Preferred examples of the photopolymerization initiators include benzoisobutyl, 2,2-dimethoxy-2-phenylacetophenone, 9,10-anthraquinone, benzophenone, Michler's ketone, 4,4'-diethylaminobenzophenone, xanthone, chloroxanthone, thioxanthone, chlorothioxanthone, 2,4-diethylthioxanthone, chlorosulfonylthioxanthone, chlorosulfonylanthraquinone, chloromethylanthraquinone, chloromethylbenzothiazole, chlorosulfonylbenzoxazole, chloromethylquinoline, chloromethylbenzophenone, chlorosulfonylbenzophenone, fluorenone, carbon tetrabromide, benzoisobutylether, benzoynisopropylether, and combination of 2,2'-bis(o-chlorophenyl)-4,4',5,5'-tetraphenylbiimidazole and 2-mercapto-5-methylthio-1,3,4-thiadiazole.

As the photopolymerization initiator, the above-mentioned compounds can be used singly or in combination of two or more kinds.

In the light-sensitive material of the invention, the photopolymerization initiator is preferably employed in an amount of 0.5 to 30% by weight, more preferably 2 to 20% by weight, based on the amount of the used polymerizable compound.

The polymerizable compounds employable in the light-sensitive material of the embodiments (2a) and (2b) are the same as those for the light-sensitive material of the embodiments (1a) and (1b).

A sensitizing agent which is optionally employed in the light-sensitive material of the embodiments (2a) and (2b) is described below.

Preferred sensitizing agents serve to increase a sensitivity when used in combination with the aforementioned photopolymerization initiator or a photopolymerization initiating system. Examples of such sensitizing agents are compounds having an active hydrogen in the molecule such as N-phenylglycine, trimethyl barbituric acid, 2-mercaptobenzoxazole, 2-mercaptobenzothiazole, 2-mercaptobenzimidazole and compounds having the formula (I) or the formula (II).

(I)

in which $R^1$ is an alkyl group, an alkylthio group or a mercapto group.

(II)

in which $R^2$ is hydrogen or an alkyl group, and $R^3$ is an alkyl group or an aryl group.

In the image formation using the light-sensitive microcapsule of the invention, the sensitizing agent is used in an amount of 0.5 to 100% by weight, more preferably 2 to 80% by weight, based on the amount of the polymerizable compound.

With respect to the embodiments (1a) and (1b), the silver halide, the polymerizable compound and the leuco dye (and optionally the reducing agent) are preferably contained in microcapsules. With respect to the embodiments (2a) and (2b), the photopolymerization initiator, the polymerizable compound and the leuco dye are preferably contained in microcapsules. The microcapsules are dispersed in a light-sensitive layer provided in a support. The optionally employable components may be arranged inside or outside of the microcapsules dispersed in the light-sensitive layer.

The microcapsules, optional components of the light-sensitive layer, and the support are described below.

There is no specific limitation on the preparation of microcapsules, and any known processes can be employed. Examples of the processes for preparing microcapsules include a process utilizing coacervation of hydrophilic wall-forming materials as described in U.S. Pat. Nos. 2,800,457 and No. 2,800 458; an interfacial polymerization process as described in U.S. Pat. No. 3,287,154, U.K. Patent No. 990,443, and Japanese Patent Publications No. 38(1963)-19574, No. 42(1967)-446 and No. 42(1967)-771; a process utilizing precipitation of polymers as described in U.S. Pat. Nos. 3,418,250 and No. 3,660,304; a process of using isocyanate-polyol wall-materials as described in U.S. Pat. No. 3,796,669; a process of using isocyanate wall-materials as described in U.S. Pat. No. 3,914,511; a process of using urea-formaldehyde or urea-formaldehyde-resorcinol wall-forming materials as described in U.S. Pat. Nos. 4,001,140, No. 4,087,376 and No. 4,089,802; a process of using wall-forming materials such as melamine-formaldehyde resins and hydroxypropyl cellulose as described in U.S.

Pat. No. 4,025,455; an in situ process utilizing polymerization of monomers as described in Japanese Patent Publication No. 36(1961)-9168 and Japanese Patent Provisional Publication No. 51(1976)-9079; a polymerization dispersing and cooling process as described in U.K. Patents No. 927,807 and No. 965,074; and a spray-drying process as described in U.S. Pat. No. 3,111,407 and U.K. Patent No. 930,422. A process for encapsulating oily droplets of the polymerizable compound is not limited to the above-mentioned ones, but a process of emulsifying core materials and then forming a polymeric membrane as a microcapsule shell over the core material is particularly preferred.

Examples of the shell material of the microcapsules include a polyamide resin and/or a polyester resin, a polyurea resin and/or a polyurethane resin, an amino-aldehyde resin, a gelatin, an epoxy resin, a complex resin containing a polyamide resin and a polyurea resin, and a complex resin containing a polyurethane resin and a polyester resin.

In the light-sensitive material of the embodiments (1a) and (1b), the silver halide is preferably arranged in the shell of the microcapsule. The microcapsule is preferably prepared by forming a polymer shell of a polymeric compound around a film composed of a reaction product of a water-soluble polymer having a sulfinyl group and a polymerizable compound having an ethylenic unsaturated group.

The light-sensitive layer may further contain optional components such as polymerization inhibitors, oxygen scavengers, oils, surface active agents, fluorescent brightening agents, discoloration inhibitors, antihalation dyes or pigments, antiirradiation dyes or pigments, dyes decolored by heating or irradiation with light, matting agents, anti-smudging agents, plasticizers, binders and solvents of the polymerizable compound.

Examples of the polymerization inhibitors include p-methoxyphenol, hyroquinone, an alkyl- or aryl-substituted hydroquinone, t-butylcatecol, naphthylamine, b-naphthol, nitrobenzene, dinitrobenzene and p-toluidine.

The polymerization inhibitor is preferably used in an amount of 0.001 to 10 weight %, and more preferably used in an amount of 0.01 to 1 weight % based on the amount of the polymerizable compound.

An oxygen scavenger can be contained in the light-sensitive layer. Examples of the oxygen scavenger include an organic phosphine, an organic phosphonate, an organic phosphite and a primary tin salt. The oxygen scavenger is preferably used in an amount of 1 to 50 weight %.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts and polyalkylene oxides.

For the purpose of anti-halation or anti-irradiation, dyes or pigments can be added to the light-sensitive layer of the light-sensitive material.

In the case that the light-sensitive layer of the light-sensitive material employes microcapsules, the dyes having properties of being decolorized when it is heated or irradiated with light can be used. The dyes having such properties can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. The size of the particle is preferably larger than that of the microcapsule. In the case that the oily droplets of the polymerizable compound is in the form of microcapsules, the size of the particle is preferably larger than that of the microcapsule.

The binder employable in the light-sensitive material can be contained in the light-sensitive layer singly or in combination. The binder preferably is a hydrophilic binder, and representative hydrophilic binders are transparent or semi-transparent binders. Examples of the binders include natural substances such as gelatin, gelatin derivatives, cellulose derivatives, starch and gum arabic, and synthetic polymeric substances such as water-soluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials, can be also employed. The binder is preferably employed in an amount of 2 to 100 wt. % based on the amount of the polymerizable compound.

In the case of using a solvent for the polymerizable compound, the solvent is preferably contained in a microcapsule which is different from the microcapsule containing the polymerizable compound.

There is no specific limitation with respect to the support employable in the invention. In the embodiments (1a) and (1b), it is preferred to use materials which are resistant to temperatures given in the developing stage.

Examples of the materials employable for the preparation of the support include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

Examples of auxiliary layers which are optionally arranged on the light-sensitive material include a heating layer, an antistatic layer, an anti-curling layer, a peel layer, a cover sheet, a protective layer, a layer containing a base or a base precursor, a base barrier layer and an anti-halation layer (colored layer).

The image recording method using the light-sensitive materials is described below.

First, use of the light-sensitive material of the embodiments (1a) and (1b) is described below.

In the use of the light-sensitive material of the first embodiment, the light sensitive material is subjected to development process simultaneously with or after imagewise exposure.

Various exposure means can be employed in the imagewise exposure, and in general, the light-sensitive material is imagewise exposed to a radiation including visible light to obtain a latent image of the silver halide. The kind of light source or the amount of light employed in the exposure can be selected depending on a light-sensitive wavelength (or intensified wavelength in the case of spectral sensitization) of the silver halide and a sensitivity of the light-sensitive material. An original image can be either monochromatic image or color image.

Development of the light-sensitive material can be conducted simultaneously with or after the imagewise exposure.

In the image-forming method according to the invention, the light-sensitive material is developed by a heat development process.

Heating in the heat development process can be conducted in various known manners. For example, the light-sensitive material may be heated by contacting the light-sensitive material or the image recording material with a heated plate (e.g., hot plate) or a drum or transferring it by means of a heat roller.

Otherwise, the light-sensitive material may be heated using an air heated to a high temperature or using a high frequency or a laser beam. Infrared heating can be also employed depending on the nature of the light-sensitive material having a polymer image formed thereon. Further, a heating process utilizing extra electric current generating through magnetic induction can be also employed.

Moreover, the light-sensitive material having a polymer image formed thereon may be heated in a bath containing a heated inert liquid (e.g., fluorine atom-containing liquid). A heating layer which is arranged on the light-sensitive material can be used as the heating means. The heat development process may be conducted under suppressing the amount of oxygen existing in the light-sensitive layer. The temperature for the heat development process usually ranges from 50° C. to 200° C., preferably from 60° C. to 150° C. The heating time is usually not shorter than 1 second, preferably from 1 second to 5 minutes, more preferably from 1 second to 1 minute.

The development process may be conducted by heating at a temperature of not lower than 50° C. under the condition that the light-sensitive layer contains a liquid in an amount of 10 to 400 wt. % based on the amount of the polymerizable compound.

The development process can be carried out with or after adding the above-mentioned base or base precursor to the light-sensitive layer instead of incorporating the base or the base precursor into the light sensitive material. For adding the base or the base precursor to the light-sensitive layer, a method of using a sheet containing the base or the base precursor (i.e., base sheet) is most easy and preferred.

The light-sensitive material is subjected to the above-mentioned heat development process to polymerize the polymerizable compound within the area where a latent image of the silver halide has been formed or the area where a latent image of the silver halide has not been formed. In the heat development process, generally, the polymerizable compound is polymerized within the area where a latent image of the silver halide has been formed. However, the polymerizable compound within the area where a latent image of the silver halide has not been formed can be polymerized by adjusting the kind or the amount of the reducing agent.

A polymer image (containing the leuco dye) obtained on the light-sensitive material as above is transferred onto the image recording material by pressing the light-sensitive material on the image recording material (preferably at a pressure of not less than 500 kg/cm$^2$).

Next, use of the light-sensitive material of the embodiments (2a) and (2b) is described below.

As an exposure means of the light-sensitive material, there can be employed various exposure means. Examples of the light sources generally used include sun light, stroboscopic light, flash light, tungsten lamp, mercury lamp, halogen lamp (e.g., iodine lamp), xenon lamp and laser light sources. Further, CRT light source, plasma light source, fluorescent tube and light emission diode can be employed. Also employable is an exposure means in which a microshutter array using LCD (liquid crystal) or PLZT (lead titanium zirconate doped with lanthanum) is combined with linear light source or plane-like light source.

In the image formation, the light-sensitive material having a polymer image formed thereon and the image recording material are pressed at a pressure of higher than 500 kg/cm$^2$ to transfer the core material with the leuco dye to the image recording material.

For applying a pressure to the light-sensitive material and the image recording material, any known pressing methods can be employed.

For example, the light-sensitive material and the image receiving material are sandwiched between press plates such as a presser or transferred using a pressure roller such as a nip roll, to apply a pressure to them. A dot-impact device can be also employed to intermittently give a pressure to them. Otherwise, a pressure may be applied to the light-sensitive material and the image recording material by spraying a high-pressure air by means of an air gun or using a ultrasonic wave-generating device or a piezo-electric element.

The pressure for pressing the light-sensitive material and the image recording material preferably is higher than 500 kg/cm$^2$, more preferably higher than 700 kg/cm$^2$.

After an image is formed on the image recording material by the above process, the image recording material can be heated to polymerize the unpolymerized polymerizable compound having been transferred onto the image recording material. Through this heating process, the obtained image can be improved in the preservability.

The light-sensitive material can be used for monochromatic or color photography, printing, radiography, medical diagnosis (e.g., CRT photography of diagnostic device using ultrasonic wave) and copy (e.g., computer graphic hard copy).

The pressure-sensitive material used in the embodiments (3a) and (3b) is described below.

The pressure-sensitive material generally comprises a layer or sheet containing a leuco dye and another layer or sheet containing a developer. The leuco dye is contained in microcapsules which are dispersed in the layer.

The leuco dye is preferably dissolved or dispersed in an appropriate organic solvent contained in the microcapsules. The organic solvent preferably has a boiling point of not lower than 180° C. Examples of the solvent include an phosphoric acid amide, an alkylated biphenyl, an alkylated terphenyl, a chlorinated paraffine, an alkylated naphthalene and a diarylethanol.

The leuco dye is preferably used in an amount of from 2 to 20 weight % based on the amount of the organic solvent.

Examples of the microcapsules and the support are the same as those of the light-sensitive material.

The heat-sensitive material used in the embodiments (4a) and (4b) is described below.

The heat-sensitive material has basically the same structure as that of the above-mentioned pressure sensitive material. The heat-sensitive material comprises a heat-sensitive layer provided on a support. The leuco dye and the developer of the present invention are preferably contained in the same layer (namely, the embodiment (4b) is preferred to (4a)).

The shell material of the microcapsules of the heat-sensitive material preferably is a polymer which is impermeable at room temperature, and becomes permeable at an elevated temperature. In detail, the shell material preferably is a polymer having a glass transition temperature in the range of 60° to 200° C.

The present invention is further described by the following examples, but those examples are given by no means to restrict the invention.

EXAMPLE 1

Preparation of dispersion of developer

Each of 44 g of the developers set forth in Table 1 (zinc salts of the salicylic acid derivatives (1) to (9) and zinc 3,5-di-α-methylbenzylsalicylate) was ground in a mortar. To the developer were added 44 g of 10% aqueous solution of polyvinyl alcohol (PVA 205 produced by Kuraray Co., Ltd.), 0.22 g of the following surface active agent (A), 0.22 g of the following surface active agent (B) and 131 g of water. The mixture was coarsely dispersing in a mixer (POLYTRONE ™) for 5 minutes. The resulting coarse dispersion was then finely dispersed in Dynomill dispersing device for 10 minutes to obtain dispersions of the developers. The particle size of the developers was not more than 1 μm.

(Surface active agent (A))

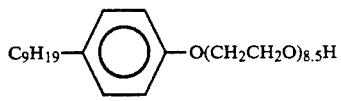

(Surface active agent (B))

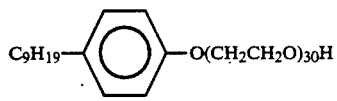

Preparation of image recording material

To 1650 g of water were added 11.9 g of a dispersing agent (Poise 520 produced by Kao Co., Ltd.) and 574 g of calcium carbonate, and the resulting mixture was stirred in Dynomill dispersing device to obtain a dispersion of particles having a particle size in the range of 1 to 2 μm. To 37.7 g of the calcium carbonate dispersion were added 14.5 g of 8% aqueous solution of polyvinyl alcohol (PVA 117 produced by Kuraray Co., Ltd.), 12 g of distilled water and 50 g of the above-prepared dispersion of the developer. The mixture was stirred at 40° C. for 30 minutes to prepare a coating solution of image recording materials (A) to (I) and (P).

The coating solution was coated on a neutral paper having basis weight of 80 g/m² using a coating rod in coating amount of 49 ml/m², and the coated layer was dried at 60° C. for 1 hour to prepare image recording materials (A) to (I) and (P).

Evaluation of image recording material

Each of the image recording materials (A) to (I) and (P) was irradiated with light at 85,000 lux at distance of 50 cm in the air using a xenon lamp for 32 hours. The yellow density of the image recording material was measured using Macbeth reflection densitometer.

The results are set forth in Table 1. In Table 1, the yellow densities are relative values on condition that the value of zinc 3,5-di-α-methylbenzylsalicylate is 100.

TABLE 1

| Image Recording Material | Developer (Zinc Salt of Salicylic Acid Derivative) | Density of Yellow Color (Stain) after Irradiation |
|---|---|---|
| (A) | Zinc Salt of (1) | 0.32 |
| (B) | Zinc Salt of (2) | 0.68 |
| (C) | Zinc Salt of (3) | 0.64 |
| (D) | Zinc Salt of (4) | 0.68 |
| (E) | Zinc Salt of (5) | 0.52 |
| (F) | Zinc Salt of (6) | 0.64 |
| (G) | Zinc Salt of (7) | 0.89 |
| (H) | Zinc Salt of (8) | 0.36 |
| (I) | Zinc Salt of (9) | 0.32 |
| (P) | Zinc 3,5-di-α-methylbenzylsalicylate | 1.00 |

It is apparent from the results in Table 1 that the yellow stain caused by light irradiation in the air is much reduced in the image recording material of the present invention.

EXAMPLE 2

Preparation of pressure-sensitive microcapsule

In 95 g of water was dissolved 5 g of partial sodium salt of polyvinylbenzenesulfonic acid (VERSA TL-502 produced by National Starch Co., Ltd.). The solution was adjusted to pH 4.0 using 20% aqueous solution of hydroxide.

Separately, 6 g of a leuco dye (Crystal Violet Lactone) was dissolved in 100 g of an alkylnaphthalene (mainly composed of diisopropylnaphthalene, produced by Kureha Chemical Industry Co., Ltd.) while heating to obtain a hydrophobic solution.

The hydrophobic solution was emulsified in 100 g of the aqueous solution of the partial sodium salt of polyvinylbenzenesulfonci acid to obtain an emulsion having mean particle size of 4.5 μm.

Separately, to 6 g of melamine were added 11 g of 37% aqueous solution of formaldehyde and 83 g of water, and the resulting mixture was stirred at 60° C. for 30 minutes to obtain a transparent melamine formaldehyde precondensate.

The precondensate was added the above-prepared emulsion. The resulting mixture was stirred, and adjusted to pH 6.0 using 20% aqueous solution of phosphoric acid under stirring. The mixture was then heated to 65° C. and stirred for 90 minutes. Further, to the mixture was added 30 g of 40% aqueous solution of urea, and the mixture was further stirred at 65° C. for 40 minutes. The resulting mixture was adjusted to pH 9.0 using 20% aqueous solution of sodium hydroxide to obtain a microcapsule dispersion.

Preparation of pressure-sensitive material (A)

To 35 g of the microcapsule dispersion were added 25 g of distilled water, 4 g of 5% aqueous solution of the surface active agent (A) used in Example 1 and 10 g of 10% aqueous solution of polyvinyl alcohol (PVA 205 produced by Kuraray Co., Ltd.). The mixture was stirred at 40° C. for 30 minutes to prepare a coating solution. The coating solution was coated on a polyethylene terephthalate film having thickness of 100 μm using a coating rod in coating amount of 57 ml/m$^2$, and the coated layer was dried at 60° C. for 30 minutes to prepare a pressure-sensitive material (A).

Image recording and evaluation thereof

The pressure-sensitive material (A) was superposed on each of the image recording materials (A), (D), (G), (H), (I) and (P) used in Example 1, and they were passed through a pressure roller at pressure of 500 kg/cm$^2$. Then the pressure-sensitive material (A) was separated from the image recording material.

Th density of the cyan color formed on the image recording material was measured using Macbeth reflection densitometer.

The results are set forth in Table 2.

TABLE 2

| Image Recording Material | Developer (Zinc Salt of Salicylic Acid Derivative) | Density of Cyan Color |
|---|---|---|
| (A) | Zinc Salt of (1) | 1.32 |
| (D) | Zinc Salt of (4) | 1.26 |
| (G) | Zinc Salt of (7) | 1.29 |
| (H) | Zinc Salt of (8) | 1.21 |
| (I) | Zinc Salt of (9) | 1.28 |
| (P) | Zinc, 3,5-di-α-methylbenzylsalicylate | 1.20 |

It is apparent from the results in Table 2 that the image recording material of the present invention is improved in the function of developing a leuco dye.

EXAMPLE 3

Preparation of light-sensitive microcapsule

In 100 g of the following polymerizable compound (MN-1, Kayarad R604 produced by Nippon Kayaku Co., Ltd.) were dissolved 20 g of the following leuco dye (RM-1) and 4.7 g of the following photopolymerization initiator (Irgacure 651 produced by Ciba Geigy) to prepare a light-sensitive composition.

(Polymerizable compound (MN-1))

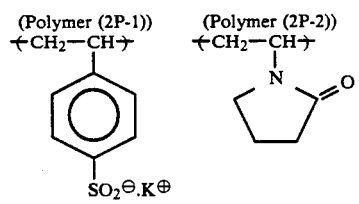

(Photopolymerization initiator)

(Leuco dye (RM-1))

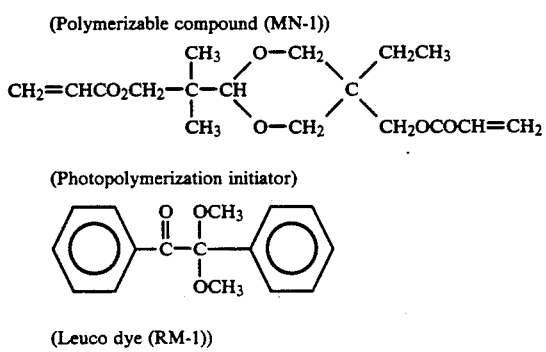

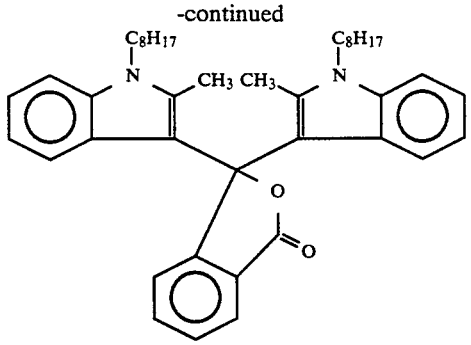

To 5.6 g of 15% aqueous solution of the following polymer (2P-1, sodium polyvinylbenzenesulfinate) was added 134.5 g of 7.1% aqueous solution of the following polymer (2P-2, polyvinyl pyrrolidone produced by Wako Junyaku Industry Co., Ltd.), and the mixture was adjusted to pH 5.0. The light-sensitive composition was added to the mixture, and the resulting mixture was stirred by using Dissolver at 3,000 r.p.m. for 30 minutes at 50° C. to obtain an O/W emulsion.

Preparation of light-sensitive material (B)

To 35.5 g of the microcapsule dispersion were added 4 ml of 5% aqueous solution of the surface active agent (A) used in Example 1 and 10 g of 10% aqueous solution of polyvinyl alcohol (PVA 205 produced by Kuraray Co., Ltd.). To the mixture was further added water to prepare 74 g of a coating solution. The coating solution was coated on a polyethylene terephthalate film having thickness of 100 μm using a coating rod in coating amount of 57 g/m$^2$, and the coated layer was dried at about 60° C. to prepare a light-sensitive material (B).

Image recording and evaluation thereof

The light-sensitive material (B) was imagewise exposed to light using a high pressure mercury lamp. The exposed light-sensitive material was superposed on each of the image recording materials (A), (D), (G), (H), (I) and (P) used in Example 1, and they were passed through a pressure roller at pressure of 500 kg/cm$^2$. Then the light-sensitive material (B) was separated from the image recording material.

Th maximum density of the magenta color and the minimum density of the yellow color formed on the image recording material were measured using Macbeth reflection densitometer.

Further, the image recording material was irradiated with light at 85,000 lux at distance of 50 cm using a xenon lamp for 24 hours. Then the minimum density of the yellow color was measured using Macbeth reflection densitometer.

The results are set forth in Table 3.

TABLE 3

| Image Recording Material | Maximum Density of Magenta | Minimum Density of Yellow | Minimum Density of Yellow After Irradiation |
|---|---|---|---|
| (A) | 1.34 | 0.08 | 0.13 |
| (D) | 1.27 | 0.11 | 0.20 |
| (G) | 1.26 | 0.09 | 0.26 |
| (H) | 1.29 | 0.11 | 0.12 |
| (I) | 1.26 | 0.13 | 0.12 |
| (P) | 1.25 | 0.10 | 0.32 |

It is apparent from the results in Table 3 that the image recording material of the present invention is improved in the function of developing a leuco dye. It is also apparent that the yellow stein caused by light irradiation is much reduced in the image recording material of the present invention.

EXAMPLE 4

Preparation of silver halide emulsion (EB-1)

In 1,500 ml of water were dissolved 18 g of gelatin and 0.5 g of sodium chloride, and the resulting gelatin solution was adjusted to pH 3.2 using 1N-sulfuric acid and was kept at 45° C. To the gelatin solution, 300 ml of an aqueous solution containing 1 g of potassium bromide and 300 ml of an aqueous solution containing 100 g of silver nitrate were added simultaneously at the same feed rate over 50 minutes. After 1 minute, to the resulting mixture was added 470 mg of the following sensitizing dye (SB-1), and after 20 minutes, to the resulting mixture were further added 100 ml of an aqueous solution containing 2.9 g of potassium iodide and 100 ml of an aqueous solution containing 3 g of silver nitrate at the same feed rate over 5 minutes. To the resulting emulsion was then added 1.2 g of polyisobutylene/monosodium maleate copolymer. After the emulsion was washed with water for desalting, 4 g of gelatin was added to the emulsion. Then, to the emulsion was further added 0.5 mg of sodium thiosulfate to chemically sensitize the emulsion at 50° C. for 15 minutes. Thus, 460 g of a silver halide emulsion (EB-1) (tetradecahedral silver iodobromide monodispersed emulsion) having mean grain size of 0.22 μm and coefficient of variation of 20% was prepared.

(Sensitizing dye (SB-1))

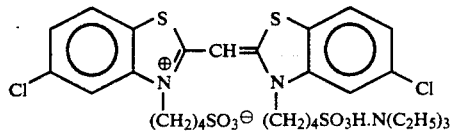

Preparation of silver halide emulsion (EG-1)

In 1,600 ml of water were dissolved 20 g of gelatin and 0.5 g of sodium chloride, and the resulting gelatin solution was adjusted to pH 3.2 using 1N-sulfuric acid and was kept at 43° C. To the gelatin solution, 200 ml of an aqueous solution containing 71 g of potassium bromide and 200 ml of an aqueous solution containing 100 g of silver nitrate were added simultaneously at the same feed rate over 30 minutes. After 5 minutes, to the resulting mixture was added 480 mg of the following sensitizing dye (SG-1), and after 10 minutes, to the resulting mixture were further added 100 ml of an aqueous solution containing 2.9 g of potassium iodide and 100 ml of an aqueous solution containing 3 g of silver nitrate at the same feed rate over 5 minutes. To the resulting emulsion was then added 1.2 g of polyisobutylene/monosodium maleate copolymer. After the emulsion was washed with water for desalting, 4.5 g of gelatin was added to the emulsion. Then, to the emulsion was further added 0.7 mg of sodium thiosulfate to chemically sensitize the emulsion at 60° C. for 15 minutes. Thus, 450 g of a silver halide emulsion (EG-1) (tetradecahedral silver iodobromide monodispersed emulsion) having mean grain size of 0.12 μm and coefficient of variation of 21% was prepared.

(Sensitizing dye (SG-1))

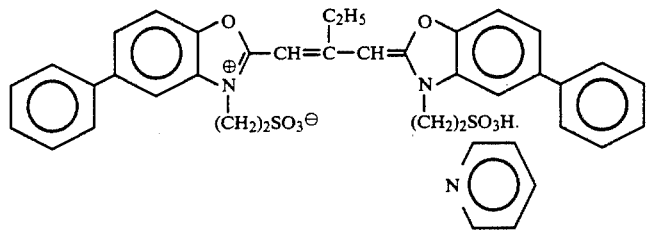

Preparation of silver halide emulsion (ER-1)

In 1,600 ml of water were dissolved 16 g of gelatin and 0.5 g of sodium chloride, and the resulting gelatin solution was adjusted to pH 3.5 using 1N-sulfuric acid and was kept at 45° C. To the gelatin solution, 200 ml of an aqueous solution containing 71 g of potassium bromide and 200 ml of an aqueous solution containing 100 g of silver nitrate were added simultaneously at the same feed rate over 30 minutes. After 1 minute, to the resulting mixture was added 510 mg of the following sensitizing dye (SR-1), and after 15 minutes, to the resulting mixture were further added 100 ml of an aqueous solution containing 3.65 g of potassium iodide and 100 ml of an aqueous solution containing 0.022 g of silver nitrate at the same feed rate over 5 minutes. To the resulting emulsion was then added 1.4 g of polyisobutylene/monosodium maleate copolymer. After the emulsion was washed with water for desalting, 3.5 g of gelatin was added to the emulsion. Then, to the emulsion was further added 0.45 mg of sodium thiosulfate to chemically sensitize the emulsion at 55° C. for 20 minutes. Thus, 430 g of a silver halide emulsion (ER-1) (tetradecahedral silver iodobromide monodispersed emulsion) having mean grain size of 0.13 μm and coefficient of variation of 24% was prepared.

(Sensitizing dye (SR-1))

-continued

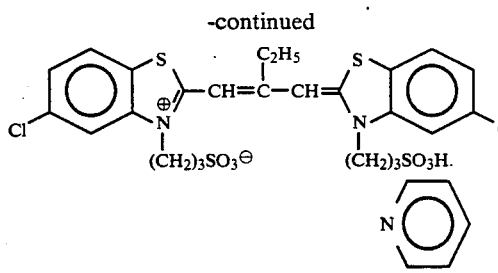

Preparation of solid dispersion (KB-1)

In a 300 ml-dispersing container were placed 160 g of 3% aqueous solution of gelatin, 40 g of the following base precursor (BG-1) and 200 ml of glass beads having a diameter in the range of 0.5 to 0.75 mm. The mixture was dispersed at 3,000 r.p.m. in Dynomill dispersing device for 30 minutes to obtain a solid dispersion (KB-1) having a particle size of not more tan 1.0 μm.

(Base precursor (BG-1))

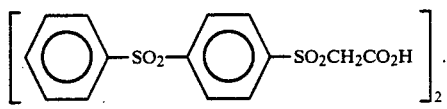

Preparation of light-sensitive composition (PB-1)

In 83 g of the following polymerizable compound (MN-2) (Kayarad R-684 of Nippon Kayaku Co., Ltd.) was dissolved 37 g of 20% solution (the solvent is the following compound (SV-1)) of the following copolymer (1P-1) and 20 g of the following yellow color image forming leuco dye (RY-1). To 51.6 g of the solution were further added 2.42 g of the following reducing agent (RD-1), 3.29 g of the following reducing agent (RD-2) and 0.006 g of the following antifogging agent (FF-1) to prepare an oily solution.

To the solution were added 4.5 g of the silver halide emulsion (EB-1) and 38 g of the solid dispersion (KB-1), and the mixture was stirred at 15,000 r.p.m. for 5 minutes at 50° C. using a homogenizer to obtain a light-sensitive composition (PR-1) in the form of a W/O emulsion.

(Polymerizable compound (MN-2))

(Copolymer (1P-1))

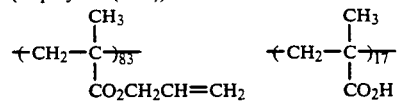

(Solvent (SV-1))

$CH_3-CH-CH_2OCH_3$
    |
    OH (Reducing agent (RD-1))

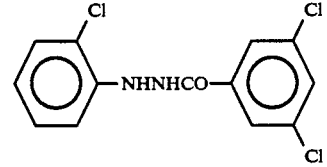

(Reducing agent (RD-2))

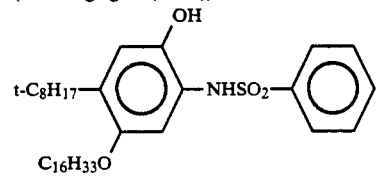

(Antifogging agent (F-1))

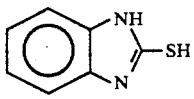

(Leuco dye (RY-1))

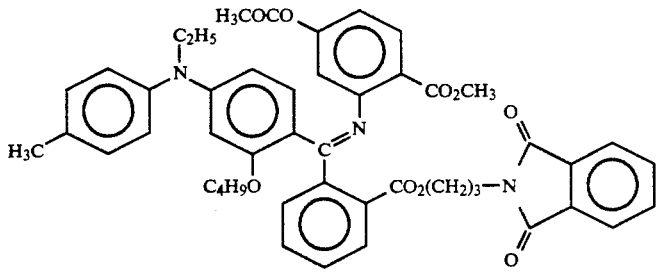

Preparation of light-sensitive composition (PG-1)

In 83 g of the polymerizable compound (MN-1) used in Example 3 was dissolved 37 g of 20% solution (the solvent is the compound (SV-1)) of the copolymer (1P-1) and 20 g of the magenta color image forming leuco dye (RM-1) used in Example 3. To 51.6 g of the solution were further added 2.42 g of the reducing agent (RD-1), 3.29 g of the reducing agent (RD-2) and 0.006 g of the antifogging agent (FF-1) to prepare an oily solution.

To the solution were added 4.5 g of the silver halide emulsion (EG-1) and 38 g of the solid dispersion (KB-1), and the mixture was stirred at 15,000 r.p.m. for 5 minutes at 50° C. using a homogenizer to obtain a light-sensitive composition (PG-1) in the form of a W/O emulsion.

Preparation of light-sensitive composition (PR-1)

In 83 g of the polymerizable compound (MN-1) used in Example 3 was dissolved 37 g of 20% solution (the solvent is the compound (SV-1)) of the copolymer (1P-1) and 20 g of the following cyan color image forming leuco dye (RC-1). To 51.6 g of the solution were further added 2.42 g of the reducing agent (RD-1), 3.29 g of the reducing agent (RD-2) and 0.006 g of the antifogging agent (FF-1) to prepare an oily solution.

To the solution were added 4.5 g of the silver halide emulsion (ER-1) and 38 g of the solid dispersion (KB-1), and the mixture was stirred at 15,000 r.p.m. for 5 minutes at 50° C. using a homogenizer to obtain a light-sensitive composition (PR-1) in the form of a W/O emulsion.

(Leuco dye (RC-1))

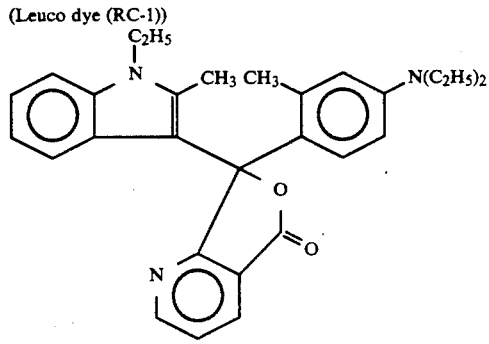

Preparation of light-sensitive microcapsule (CB-1)

To 10 g of 15% aqueous solution of the polymer (2P-1) used in Example 3 was added 162 g of 7.1% aqueous solution of the polymer (2P-2) used in Example 3, and the mixture was adjusted to pH 5.0. The light sensitive composition (PB-1) was added to the mixture, and the resulting mixture was stirred by using Dissolver at 3,000 r.p.m. for 30 minutes at 50° C. to obtain a W/O/W emulsion.

Separately, to 14.8 g of melamine were added 20.0 g of 37% aqueous solution of formaldehyde and 76.3 g of distilled water, and the resulting mixture was stirred at 60° C. for 40 minutes to obtain a transparent melamine-formaldehyde precondensate.

To 69.3 g of the precondensate was added the above-prepared W/O/W emulsion, and the resulting mixture was adjusted to pH 5.0 using 10% aqueous solution of sulfuric acid. The mixture was then heated to 60° C. and stirred for 120 minutes, and adjusted to pH 6.5 using 10% aqueous solution of sodium hydroxide to prepare a light-sensitive microcapsule dispersion (CB-1) containing microcapsules having a melamine-formaldehyde resin shell was obtained.

Preparation of light-sensitive microcapsule (CG-1)

A light-sensitive microcapsule dispersion (CG-1) was prepared in the same manner as in the preparation of the light-sensitive microcapsule dispersion (CB-1) except that the light-sensitive composition (PG-1) was used in place of the light-sensitive composition (PB-1).

Preparation of light-sensitive microcapsule (CR-1)

A light-sensitive microcapsule dispersion (CR-1) was prepared in the same manner as in the preparation of the light-sensitive microcapsule dispersion (CB-1) except that the light-sensitive composition (PR-1) was used in place of the light-sensitive composition (PB-1).

Preparation of light-sensitive material (C)

To a mixture of 20.0 g of the light-sensitive microcapsule dispersion (CB-1), 20.0 g of the light-sensitive microcapsule dispersion (CG-1) and 20.0 g of the light-sensitive microcapsule dispersion (CR-1) were added 4 g of 5% aqueous solution of the surface active agent (A) used in Example 1 and 10 g of 10% aqueous solution of polyvinyl alcohol (PVA 205 produced by Kuraray Co., Ltd.), and the mixture was stirred at 40° C. for 30 minutes to prepare a coating solution for a light-sensitive layer.

The coating solution was coated over an undercoated polyethylene terephthalate film (thickness: 80 μm) in an amount of 120 ml/m², and the coated layer of the solution was dried at 40° C. for 1 hour to prepare a light-sensitive material (C).

Image recording and evaluation thereof

The light-sensitive material (C) was imagewise exposed to light using a tungsten lamp, and then heated on a hot plate at 135° C. for 10 seconds. The exposed and heated light-sensitive material was superposed on each of the image recording materials (A) to (I) and (P) used in Example 1, and they were passed through a pressure roller at pressure of 500 kg/cm². Then the light-sensitive material (C) was separated from the image recording material.

Th maximum density of the black color and the minimum density of the yellow color formed on the image recording material were measured using Macbeth reflection densitometer.

Further, the image recording material was irradiated with light at 85,000 lux at distance of 50 cm using a xenon lamp for 24 hours. Then the minimum density of the yellow color was measured using Macbeth reflection densitometer.

The results are set forth in Table 4.

TABLE 4

| Image Recording Material | Maximum Density of Black | Minimum Density of Yellow | Minimum Density of Yellow After Irradiation |
|---|---|---|---|
| (A) | 1.28 | 0.09 | 0.14 |
| (B) | 1.23 | 0.11 | 0.20 |
| (C) | 1.26 | 0.10 | 0.19 |
| (D) | 1.23 | 0.10 | 0.21 |
| (E) | 1.21 | 0.08 | 0.21 |
| (F) | 1.27 | 0.13 | 0.24 |
| (G) | 1.26 | 0.12 | 0.28 |
| (H) | 1.26 | 0.11 | 0.14 |
| (I) | 1.25 | 0.11 | 0.13 |
| (P) | 1.22 | 0.11 | 0.33 |

It is apparent from the results in Table 4 that the image recording material of the present invention is improved in the function of developing a leuco dye. It is also apparent that the yellow stein caused by light irradiation is much reduced in the image recording material of the present invention.

EXAMPLE 5

Preparation of pressure-sensitive microcapsule

A pressure-sensitive microcapsule dispersion was prepared in the same manner as in Example 2, except that the amount of the leuco dye (Crystal Violet Lactone) was changed from 6 g to 4 g.

Preparation of pressure-sensitive recording material

To 1650 g of water were added 11.9 g of a dispersing agent (Poise 520 produced by Kao Co., Ltd.) and 574 g of calcium carbonate, and the resulting mixture was stirred in Dynomill dispersing device to obtain a dispersion of particles having a particle size in the range of 1 to 2 μm. To 10 g of the calcium carbonate dispersion were added 3 g of 8% aqueous solution of polyvinyl alcohol (PVA 117 produced by Kuraray Co., Ltd.), 10 g of the dispersion of the developer (A), (G), (I) or (P) prepared in Example 1 and 10 g of the pressure-sensitive microcapsule dispersion to prepare a coating solution of pressure-sensitive image recording materials (A), (G), (I) and (P).

The coating solution was coated on a cardboard of 80 g/m² using a coating rod in solid amount of 10 g/m², and the coated layer was dried to prepare pressure-sensitive image recording materials (A), (G), (I) and (P).

Image recording and evaluation thereof

Yellow density of each of the pressure-sensitive image recording materials (A), (G), (I) and (P) was measured using Macbeth reflection densitometer.

Further, each of the pressure-sensitive image recording material was irradiated with light at 25,000 lux using a fluorescent lamp for 3 weeks. Then, the yellow color was measured using Macbeth reflection densitometer.

Furthermore, each of the pressure-sensitive image recording material was passed through nip rolls at pressure of 600 kg/cm². Then, the density of the cyan color formed on the image recording material was measured using Macbeth reflection densitometer.

The results are set forth in Table 5.

TABLE 5

| Image Recording Material | Developer | Yellow Density | Yellow Density After Irradiation | Density of Cyan Color |
|---|---|---|---|---|
| (A) | Zinc Salt of (1) | 0.12 | 0.13 | 1.10 |
| (G) | Zinc Salt of (7) | 0.13 | 0.15 | 1.05 |
| (I) | Zinc Salt of (9) | 0.10 | 0.12 | 1.07 |
| (P) | Zinc 3,5-di-α-methyl-benzyl-salicylate | 0.11 | 0.41 | 1.05 |

It is apparent from the results in Table 5 that the image recording material of the present invention is improved in the function of developing a leuco dye. It is also apparent that the yellow stein caused by light irradiation is much reduced in the image recording material of the present invention.

EXAMPLE 6

Preparation of light-sensitive microcapsule

In 35 g of trimethylolpropane triacrylate was dissolved 0.7 g of 2-mercapto-5-methylthio-1,3,4-thiadiazole using an ultrasonic dispersing device. In 6 g of methylene chloride were dissolved 0.7 g of 4,4'-bis(-diethylamino)benzophenone, 2.1 g of 2,2'-bis(o-chlorophenyl)-4,4',5,5'-tetraphenylbiimidazole and 2.1 g of 3-diethylamino-6-chlor-7-anilinoflorane (leuco dye). The two solutions were mixed to form an oil phase.

Separately, to 17.5 g of gum arabic were added 18.8 g of 12% aqueous solution of isobutylene/maleic anhydride copolymer and 26.8 g of distilled water, and the resulting mixture was adjusted to pH 3.5 using 10% aqueous solution of sulfuric acid. To the mixture were further added 4.6 g of urea and 0.6 g of resorcinol, and the above-prepared oil phase was emulsified in the resulting mixture to obtain an emulsion having mean particle size of 3 μm. To the emulsion was added 12.9 g of 36 % aqueous solution of formaldehyde, and the mixture was stirred and heated to 60° C. After 1 hour, to the mixture was added 9.0 g of 5% aqueous solution of ammonium sulfate, and the resulting mixture was stirred at 60° C. for 1 hour. The mixture was cooled, and adjusted to pH 9.0 using an aqueous solution of sodium hydroxide to prepare a light-sensitive microcapsule dispersion.

Preparation of light-sensitive recording material

To 10 g of the calcium carbonate dispersion prepared in Example 5 were added 3 g of 8% aqueous solution of polyvinyl alcohol (PVA 117 produced by Kuraray Co., Ltd.), 10 g of the dispersion of the developer (A), (G), (I) or (P) prepared in Example 1 and 10 g of the light-sensitive microcapsule dispersion to prepare a coating solution of light-sensitive image recording materials (A), (G), (I) and (P).

The coating solution was coated on a cardboard of 80 g/m² using a coating rod in solid amount of 12 g/m², and the coated layer was dried to prepare light-sensitive image recording materials (A), (G), (I) and (P).

Image recording and evaluation thereof

Each of the light-sensitive image recording materials (A), (G), (I) and (P) was imagewise exposed to light using a high pressure mercury lamp. The exposed light-sensitive image recording material was passed through nip rolls at pressure of 600 kg/cm² to form a black positive image on the image recording material.

Th maximum density of the black color and the minimum density of the yellow color formed on the image recording material were measured using Macbeth reflection densitometer.

Further, the image recording material was irradiated with light at 25,000 lux using a fluorescent lamp for 3 weeks. Then the minimum density of the yellow color was measured using Macbeth reflection densitometer.

The results are set forth in Table 6.

TABLE 6

| Image Recording Material | Maximum Density of Black | Minimum Density of Yellow | Minimum Density of Yellow After Irradiation |
|---|---|---|---|
| (A) | 1.25 | 0.13 | 0.14 |
| (G) | 1.18 | 0.15 | 0.18 |
| (I) | 1.22 | 0.11 | 0.13 |
| (P) | 1.17 | 0.14 | 0.45 |

It is apparent from the results in Table 6 that the image recording material of the present invention is improved in the function of developing a leuco dye. It is also apparent that the yellow stein caused by light irradiation is much reduced in the image recording material of the present invention.

EXAMPLE 7

Preparation of light-sensitive recording material

To 15 g of the calcium carbonate dispersion prepared in Example 5 were added 4.5 g of 8% aqueous solution of polyvinyl alcohol (PVA 117 produced by Kuraray Co., Ltd.), 15 g of the dispersion of the developer (A) to (I) or (P) prepared in Example 1, 5 g of the light-sensitive microcapsule dispersion (CB-1) prepared in Example 4, 5 g of the light-sensitive microcapsule dispersion (CG-1) prepared in Example 4 and 5 g of the light-sensitive microcapsule dispersion (CR-1) prepared in Example 4 to prepare a coating solution of light-sensitive image recording materials (A) to (I) and (P).

The coating solution was coated on a cardboard of 80 g/m² using a coating rod in solid amount of 15 g/m², and the coated layer was dried to prepare light-sensitive image recording materials (A) to (I) and (P).

Image recording and evaluation thereof

Each of the light-sensitive image recording materials (A) to (I) and (P) was imagewise exposed to light using a tungsten lamp, and then heated on a hot plate at 135° C. for 10 seconds. The exposed and heated light-sensitive image recording material was passed through nip rolls at pressure of 500 kg/cm² to form a black positive image on the image recording material.

Th maximum density of the black color and the minimum density of the yellow color formed on the image recording material were measured using Macbeth reflection densitometer.

Further, the image recording material was irradiated with light at 25,000 lux using a fluorescent lamp for 3 weeks. Then the minimum density of the yellow color was measured using Macbeth reflection densitometer.

The results are set forth in Table 7.

TABLE 7

| Image Recording Material | Maximum Density of Black | Minimum Density of Yellow | Minimum Density of Yellow After Irradiation |
|---|---|---|---|
| (A) | 1.25 | 0.09 | 0.10 |
| (B) | 1.22 | 0.10 | 0.14 |
| (C) | 1.25 | 0.09 | 0.13 |
| (D) | 1.20 | 0.09 | 0.13 |
| (E) | 1.20 | 0.08 | 0.12 |
| (F) | 1.25 | 0.08 | 0.11 |
| (G) | 1.25 | 0.10 | 0.13 |
| (H) | 1.26 | 0.09 | 0.10 |
| (I) | 1.25 | 0.08 | 0.10 |
| (P) | 1.20 | 0.10 | 0.41 |

It is apparent from the results in Table 7 that the image recording material of the present invention is improved in the function of developing a leuco dye. It is also apparent that the yellow stein caused by light irradiation is much reduced in the image recording material of the present invention.

I claim:

1. An image recording material comprising a support and an image recording layer provided thereon which contains a developer of a leuco dye,
wherein the developer is a salicylic acid derivative having the formula (I) or its metal salt;

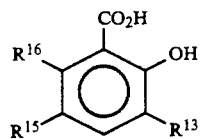

(I)

in which $R^{13}$ is a tertiary alkyl group or a tertiary aralkyl group; $R^{15}$ is a monovalent group selected from the group consisting of hydrogen, an alkyl group, an aryl group and a tertiary aralkyl group; $R^{16}$ is an alkyl group or an aryl group; and when $R^{15}$ is hydrogen, $R^{13}$ is a tertiary aralkyl group.

2. The image recording material as claimed in claim 1, wherein the developer is contained in the image recording layer in a coating amount of 0.1 to 50 g/m².

3. The image recording material as claimed in claim 1, wherein the developer is a metal salt of the salicylic acid derivative having the formula (I).

4. The image recording material as claimed in claim 3, wherein the metal of the salt is selected from the group consisting of zinc, tin, aluminium and nickel.

5. The image recording material is claimed in claim 1, wherein the developer is a zinc salt of the salicylic acid derivative having the formula (I).

* * * * *